United States Patent [19]
Penrod

[11] 3,993,984
[45] Nov. 23, 1976

[54] ELECTRONIC UNDERFREQUENCY RELAY

[75] Inventor: John K. Penrod, Bellbrook, Ohio

[73] Assignee: Power Management Corporation, Dayton, Ohio

[22] Filed: Apr. 8, 1975

[21] Appl. No.: 566,094

[52] U.S. Cl. .................. 340/248 A; 324/78 D; 324/78 Q; 324/78 Z; 324/186; 307/234; 328/134

[51] Int. Cl.² ............................... G08B 21/00

[58] Field of Search ............. 324/79 D, 186, 187, 324/181, 78 D, 78 Q, 78 Z; 307/233 R, 234; 328/133, 134; 340/253 Y, 248 A; 235/92 FQ, 92 TF

[56] References Cited
UNITED STATES PATENTS

| | | |
|---|---|---|
| 3,842,347 | 10/1974 | Terbrack .................. 324/186 |
| 3,895,293 | 7/1975 | Munz ..................... 324/186 |

Primary Examiner—Gerard R. Strecker
Assistant Examiner—Michael J. Tokar
Attorney, Agent, or Firm—Biebel, French & Nauman

[57] ABSTRACT

A method and apparatus for detecting an underfrequency condition of an alternating current power line is disclosed wherein the frequency of the power line is sensed, an underfrequency signal is developed whenever the power line frequency decreases below a predetermined frequency, a known frequency source is thereafter substituted for the alternating current power line, and the frequency of this source is checked by the same circuitry to produce a second output signal, and an underfrequency signal is generated in response to both first and second output signals.

4 Claims, 2 Drawing Figures

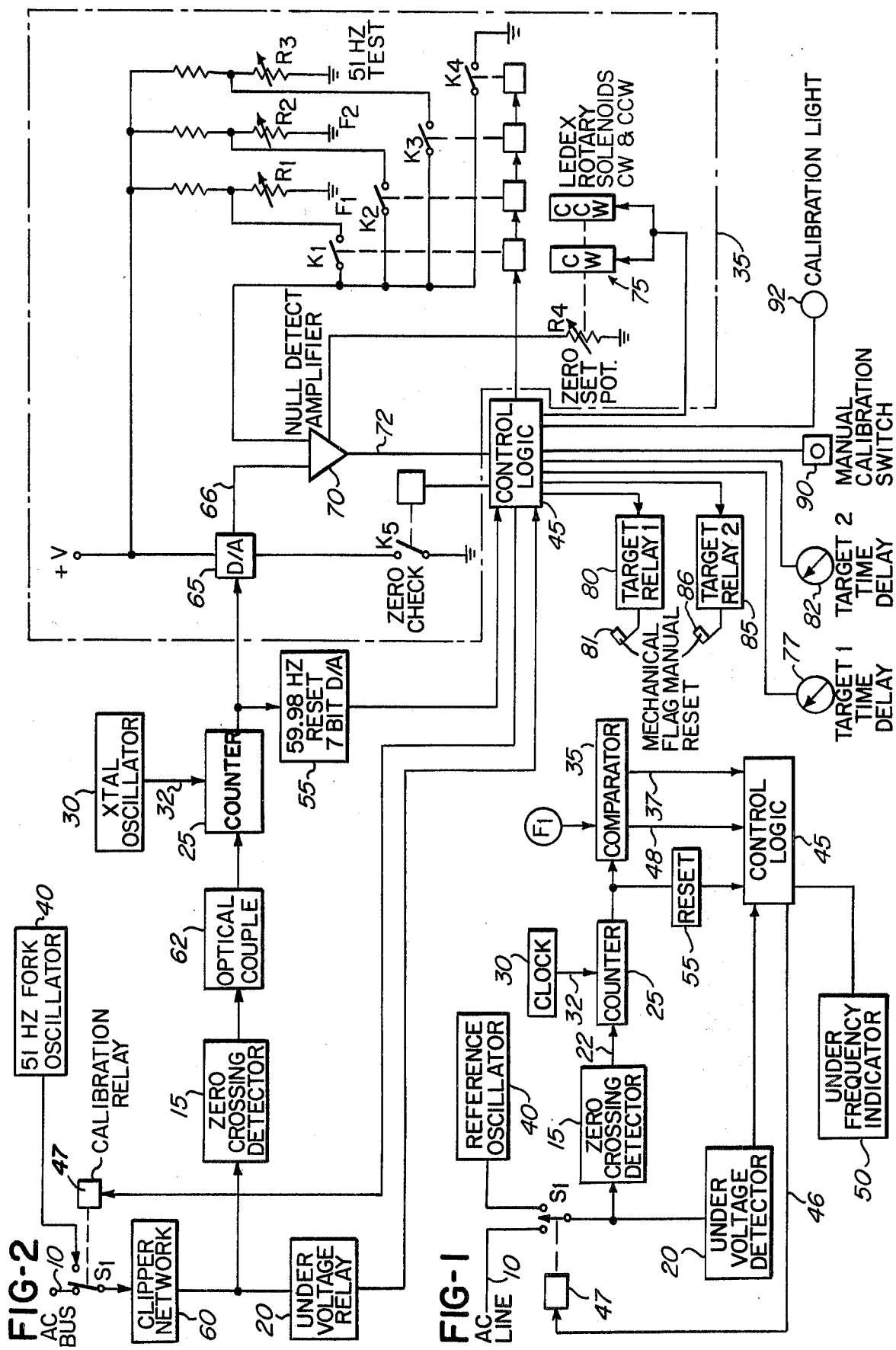

ELECTRONIC UNDERFREQUENCY RELAY

BACKGROUND OF THE INVENTION

This invention relates to an underfrequency relay for monitoring the frequency of an alternating current power line and for providing an output signal whenever the frequency decreases below a predetermined value for a specific length of time.

The frequency of an alternating current power system must be maintained within a very narrow range of frequencies. Should the frequency decrease appreciably below 60 Hertz, in the United States, for example, this may be an indication of an abnormal condition requiring a utility company to disconnect or shed some of its load in order to maintain its generators on line, even at the lower frequency.

The measurement of a power line underfrequency has been accomplished in several ways. One technique for measuring the period is to provide an oscillator, the frequency of which is substantially higher than the line frequency being measured, and counting the number of pulses from the oscillator during the period. Should the line frequency decrease, the period will correspondingly increase, and thereafter a high number of oscillator output pulses will be counted. Highly accurate frequency measurements may be made in this manner.

SUMMARY OF THE INVENTION

This invention relates specifically to an underfrequency device utilizing the above mentioned technique and further employing a reference oscillator, the output of which is substituted for the line frequency whenever an underfrequency condition is detected in order to provide a check on the proper operation of the system.

It is highly undesirable to indicate an underfrequency condition, with the consequent shedding of loads, when an underfrequency condition does not in fact exist, primarily because of the inconvenience caused the customers whose power was cut unannounced, but also because of the difficulty and time it takes to restore power to those customers.

Accordingly, it is an object of this invention to provide a method of detecting an underfrequency condition on an alternating current power line including the steps of sensing by electrical circuit means the frequency of the alternating current power line, generating a first output signal upon the detection of a deviation of said power line frequency from a predetermined frequency, thereafter sensing by the same circuit means the output of a known frequency source and generating a second output signal only if the frequency of the known frequency source is deemed to be proper, and generating a power line underfrequency signal in response to both said first and second output signals.

It is also an object of this invention to provide an apparatus for detecting an underfrequency condition on an alternating current power line including means for generating clock pulses at a fixed frequency substantially higher than said alternating current line frequency, means for generating pulse signals representing the alternating current line frequency, counter means for counting the number of clock pulses occurring during the interval between adjacent line frequency pulse signals, means for generating an underfrequency signal whenever the number of clock pulses in said interval is greater than an adjustable predetermined number, means for generating a known frequency, means responsive to said first output signal for substituting said known frequency for said alternating current power line frequency, means for generating a second output signal in response to the output of said counter containing not more than a predetermined number of clock pulses within the interval between adjacent substitute pulse signals, and generating a power line underfrequency signal in response to both said first and said second output signals.

Other objects and advantages of the invention will be apparent from the following description, the accompany-drawings and the appended claims.

BRIEF DESCRIPTION OF THE DRAWINGS

FIG. 1 is a simplified electrical block diagram of the invention; and

FIG. 2 is a more detailed electrical block diagram of the invention.

DETAILED DESCRIPTION OF THE PREFERRED EMBODIMENT

Reference is now made to the drawings which show a preferred embodiment of the invention, and particularly to FIG. 1 which is a simplified electrical block diagram. The circuit described therein is designed to sense an underfrequency condition on an alternating current power line 10 and to provide an underfrequency signal if the power line frequency decreases below a predetermined frequency for a specified length of time. The circuit is provided with a self-checking means to prevent a false power line underfrequency signal from being generated.

The alternating current power line is connected through a switch S1 to a zero crossing detector 15 and undervoltage detector 20. The undervoltage detector 20 is provided to disable the circuit whenever the alternating current line voltage falls below a predetermined value.

The zero crossing detector 15 will generate pulse signals representing the alternating current line frequency on its output line 22 to counter means 25. The zero crossing detector will produce a pulse signal each time the alternating current line voltage crosses zero in the positive going direction. Thus, there will be one pulse for each complete alternating current cycle.

A crystal oscillator 30 generates clock pulses at a fixed and stable frequency which is substantially higher than the alternating current line frequency. These clock pulses are supplied to the counter 25 on line 32.

The counter 25 is designed to accept and count the number of clock pulses on line 32 occurring during the interval between adjacent line frequency pulse signals on line 22. Therefore, the number of clock pulses counted in the interval will be dependent upon the frequency of the alternating current line 10. For example, if the line frequency decreases, the interval between adjacent pulse signals on line 22 will be longer, and more clock pulses will be counted by the counter 25 during that interval.

The status of the counter 25 is monitored by a comparator 35. The comparator 35 will produce an underfrequency signal on line 37 whenever the number of clock pulses in the counter 25 within one cycle of the line frequency exceeds the number set into the comparator by the frequency dial F1.

The apparatus shown in FIG. 1 also includes a reference oscillator 40 for generating an output of a known, fixed frequency. The reference oscillator is connected to the zero crossing detector 15 through switch S1.

Control logic circuit 45 responds to an underfrequency signal on line 37 and provides an output on line 46 to relay 47 to operate the switch S1 and thereby substitute the known frequency output of oscillator 40 for the alternating current power line frequency on line 10. This is to insure that the underfrequency detecting circuit is operating properly before generating a power line underfrequency signal.

The output of oscillator 40 is processed in the same way as the alternating current power line signal. The comparator 35 will generate a second output signal on line 48 if the output in the counter 25 does not receive more than a predetermined number of clock pulses within the interval between adjacent pulse signals generated in response to the output of the reference oscillator 40.

The control logic circuit 45 will generate a power line underfrequency signal by activating a first indicator 50 only if there was a first power line underfrequency signal generated on line 37 followed by a second output on line 48.

A reset circuit 55 senses the output of counter 25 and resets the control logic circuit 45 if the frequency on the alternating current line 10 thereafter increases above a predetermined frequency.

Referring now to the block diagram of FIG. 2 which illustrates in more detail the preferred embodiment of the invention, the alternating current power line 10 is connected through switch S1 to a clipper control network 60, the output of which is applied to both the zero crossing detector 15 and the undervoltage detector 20. The output of the zero crossing detector is connected to an optical coupler 62 to provide electrical isolation between the alternating current power line and the remainder of the underfrequency detection circuitry. The output optical coupler is connected to counter 25.

The crystal oscillator 30 provides clock pulses to the counter at a fixed and stable frequency substantially higher than the alternating line current frequency. The number of clock pulses provided the counter 25 between adjacent pulse signals from the optical coupler 62 will therefore represent the frequency of the alternating current line.

The comparator circuit 35 may take many forms, such as a digital comparator which senses when the counter 25 reaches or exceeds a predetermined number. On the other hand, the counter 25 may be preset on the beginning of each interval to a predetermined number with the clock pulses causing the counter to count down; and if the counter should reach a zero level (or some predetermined number) before the end of the interval, then an underfrequency condition would be indicated.

The comparator circuit in the embodiment shown in FIG. 2 includes a digital to analog (D/A) device 65, the output voltage of which is a function of the number stored in the counter 25. If the frequency on line 10 decreases, then the number of clock pulses in the counter 25 will increase, and the analog voltage output from the D/A device 65 will change. The sensitivity of the comparator 35 will therefore be a function of the frequency of the oscillator 30 and the resolution of the D/A device 65.

The analog output of the D/A device 65 on line 66 is applied to a null detecting amplifier 70 which forms part of a bridge circuit. Also connected to the amplifier 70 are potentiometers R1, R2 and R3; these potentiometers are individually connected in the bridge circuit by the contacts of relays K1, K2 and K3 which are operated under control of the logic circuit 45.

In the embodiment shown in FIG. 2, potentiometer R1 establishes a first underfrequency condition, potentiometer R2 is set for a second underfrequency condition lower than that set by R1, and potentiometer R3 is set to correspond to the frequency of the reference oscillator 40. The adjustable arm of potentiometer R1 is therefore connected to the frequency set dial F1 shown in FIG. 1.

In normal operation, relay K1 is closed at the beginning of the test sequence and potentiometer R1 is set to represent a first frequency (F1) of 59.5 Hertz, for example.

If the frequency of the alternating current line 10 does not decrease to that value, then there will be no output from the null detector 70.

If the line frequency does decrease, and the voltage output of the D/A device 65 on line 66 changes to match the voltage set by potentiometer R1, then a first underfrequency signal will be generated on the output 72 of the null detector, and this will be detected by the control circuit 45.

In order to insure that an underfrequency condition does in fact exist, the entire underfrequency circuit will then be checked for proper operation.

Logic circuit 45 will cause the zero check relay K4 to close and place a ground (or a calibrated resistance) on one side of the bridge circuit. Relay K5 will preset at D/A device 65 to provide an output such that the other side of the bridge will be balanced, and any output of the null detector 70 will be applied to the logic circuit device 45 which will cause rotary solenoids 75 to adjust to zero set potentiometer R4 so that a null output will exist on line 72.

The control logic circuit 45 will next cause relay K3 to close and place potentiometer R3 in the bridge circuit. At the same time, relay 47 will operate switch S1, removing the alternating current line from the circuit and substituting therefor the output of reference oscillator 40. If the circuit is operating properly, a null will be sensed by the null detector 70, and its output on line 72 will be the second output signal representing proper operation of the device, i.e., that not more than a predetermined number of clock pulses will exist within the interval between adjacent pulses generated by the reference oscillator 40.

It will be understood that the reference oscillator 40 may be the same frequency as the alternating current line frequency, or it may be any other fixed frequency as determined by the setting of potentiometer R3. As shown in FIG. 2, the reference oscillator is a 51 Hertz fork oscillator.

A time delay circuit is provided to insure that an underfrequency condition (F1) is not indicated until it exists either for a predetermined time delay or a predetermined number of cycles of the alternating current line. The time delay may be adjusted by the time delay control 77. If the underfrequency condition does exist for the predetermined time delay, then a target relay 80 will close, and a manual flag 81 displayed to indicate this condition.

If an underfrequency condition is determined by the setting of potentiometer R1 exists for the specified time delay, then the control circuit 45 will next cause relay K2 to close and establish a new target frequency (F2), as determined by potentiometer R2. If the line frequency falls below the frequency set by R2 for a time delay determined by the time delay control 82, then target relay 85 will be energized, and this condition indicated by flag 86. Of course, the frequency represented by potentiometer R2 is lower than that represented by potentiometer R1.

A manual calibrating switch 90 is provided to initiate the calibrating sequence independently of the operation of the null detector 70. A calibrating light 92 will be illuminated should it be impossible to calibrate the system.

Thus, there has been described an apparatus which provides an underfrequency signal should the power line frequency decrease below a predetermined frequency for a specified period of time, but only if the circuit has been checked fpr proper operation by substituting a known frequency source for the alternating current from the power line.

While the method and form of apparatus herein described constitute preferred embodiments of the invention, it is to be understood that the invention is not limited to this precise method and form of apparatus, and that changes may be made therein without departing from the scope of the invention which is defined in the appended claims.

What is claimed is:

1. A method of detecting and indicating an underfrequency condition of an alternating current power line including the steps of sensing the frequency of the alternating current power line by circuit means which measures the time interval between adjacent cycles of said line frequency, and providing a first signal whenever the frequency of the power line decreases below a predetermined frequency;

generating a known frequency signal and substituting said known frequency signal for the alternating current line frequency in response to said first signal, measuring the time interval between adjacent cycles of the known frequency signal by said curcuit means, and providing a second signal if the frequency of said known frequency signal is detected to be within predetermined limits; and indicating a power line underfrequency condition only in response to both said first and second signals.

2. The method of detecting an underfrequency condition on an alternating current power line including the steps of generating clock pulses at a fixed frequency substantially higher than said alternating current line frequency, counting said clock pulses occurring during the interval between adjacent cycles of the line frequency by a counting circuit means, generating a first output signal upon the detection of a number of clock pulses in said interval greater than a predetermined number, generating a known frequency signal and substituting said signal for said alternating line current frequency, in response to said first output signal, as an input to said counting circuit means, counting the number of clock pulses occurring during the interval between adjacent cycles of the known frequency signal by said counting circuit means, generating a second output signal upon detection of not more than a predetermined number of clock pulses within said interval between adjacent cycles of the known frequency signal, and generating a power line underfrequency signal in response to both said first and second output signals.

3. Apparatus for detecting an underfrequency condition on an alternating current power line including means for generating clock pulses at a fixed frequency substantially higher than said alternating current line frequency, counter means for counting the number of clock pulses occurring during the interval between adjacent cycles of said line frequency, means for generating a first output signal whenever the number of clock pulses in said interval is greater than an adjustable predetermined number, means for generating a known frequency signal, means responsive to said first output signal for substituting said known frequency signal for said alternating current power line frequency as an input to said counter means, means for generating a second output signal in response to the output of said counter containing not more than a predetermined number of clock pulses within the interval between adjacent cycles of the known frequency signal, and means for generating a power line underfrequency signal only when both said first and second output signals have been generated.

4. The apparatus of claim 3 including means for inhibiting an underfrequency signal from being generated upon detection of a power line frequency above a predetermined minimum frequency.

* * * * *